(12) United States Patent
Jung et al.

(10) Patent No.: US 11,576,261 B2
(45) Date of Patent: Feb. 7, 2023

(54) CONNECTION STRUCTURE EMBEDDED SUBSTRATE

(71) Applicant: SAMSUNG ELECTRO-MECHANICS CO., LTD., Suwon-si (KR)

(72) Inventors: Joo Hwan Jung, Suwon-si (KR); Jae Woong Choi, Suwon-si (KR); Seung Eun Lee, Suwon-si (KR); Yong Hoon Kim, Suwon-si (KR); Jin Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/196,651

(22) Filed: Mar. 9, 2021

(65) Prior Publication Data

US 2022/0192020 A1 Jun. 16, 2022

(30) Foreign Application Priority Data

Dec. 16, 2020 (KR) .......................... 10-2020-0176666

(51) Int. Cl.
*H05K 1/11* (2006.01)
*H05K 1/18* (2006.01)
(Continued)

(52) U.S. Cl.
CPC ........... *H05K 1/113* (2013.01); *H05K 1/0313* (2013.01); *H05K 1/115* (2013.01); *H05K 1/142* (2013.01);
(Continued)

(58) Field of Classification Search
CPC ...... H05K 1/113; H05K 1/0313; H05K 1/181; H05K 2201/09518; H05K 3/4694; H05K 1/142; H05K 1/0243; H05K 1/115; H05K 3/4655; H01L 23/5383; H01L 23/5384; H01L 23/5385; H01L 24/16; H01L 2224/16237; H01L 23/3128; H01L 24/02; H01L 25/16; H01L 2224/02331; H01L 2224/02333; H01L 2224/02373; H01L 2224/02381; H01L 23/485; H01L 23/49827
See application file for complete search history.

(56) References Cited

U.S. PATENT DOCUMENTS 8,331,102 B2 * 12/2012 Inagaki ................. H05K 1/186
361/765
9,439,289 B2 * 9/2016 Furutani ................. H05K 1/111
(Continued)

FOREIGN PATENT DOCUMENTS

JP 2014-90080 A 5/2014
KR 10-2020-0092236 A 8/2020

*Primary Examiner* — Ishwarbhai B Patel
(74) *Attorney, Agent, or Firm* — Morgan, Lewis & Bockius LLP

(57) ABSTRACT

A connection structure embedded substrate includes a printed circuit board including a first insulating body and a plurality of first wiring layers disposed on at least one of an external region or an internal region of the first insulating body; and a connection structure embedded in the first insulating body and including first and second substrates. The first and second substrates are disposed adjacent to each other.

31 Claims, 14 Drawing Sheets

(51) Int. Cl.
*H05K 1/14* (2006.01)
*H05K 1/03* (2006.01)
*H05K 1/02* (2006.01)

(52) U.S. Cl.
CPC ........... *H05K 1/181* (2013.01); *H05K 1/0243* (2013.01); *H05K 2201/09518* (2013.01)

(56) References Cited

U.S. PATENT DOCUMENTS

| | | | |
|---|---|---|---|
| 2011/0100698 A1* | 5/2011 | Naganuma | H05K 3/4694 174/264 |
| 2013/0014982 A1* | 1/2013 | Segawa | H05K 1/142 29/830 |
| 2013/0025925 A1* | 1/2013 | Naganuma | H05K 3/4694 174/262 |
| 2014/0118976 A1 | 5/2014 | Yoshikawa et al. | |
| 2020/0083179 A1* | 3/2020 | Lee | H01L 23/49894 |
| 2020/0105677 A1* | 4/2020 | Chiba | H01L 23/5383 |
| 2020/0185357 A1* | 6/2020 | Byun | H01L 23/3171 |
| 2020/0243450 A1* | 7/2020 | Cho | H01L 23/49822 |

* cited by examiner

CONNECTION STRUCTURE EMBEDDED SUBSTRATE

CROSS-REFERENCE TO RELATED APPLICATION(S)

This application claims benefit of priority to Korean Patent Application No. 10-2020-0176666 filed on Dec. 16, 2020 in the Korean Intellectual Property Office, the disclosure of which is incorporated herein by reference in its entirety.

TECHNICAL FIELD

The present disclosure relates to a connection structure embedded substrate.

BACKGROUND

A high-performance semiconductor has been used in an artificial intelligence (AI) accelerator used in a server, a network, and a vehicle component or in the field of autonomous driving. The above-mentioned components may be high-performance products including a large number of semiconductor input/output terminals (I/O) and transistors, and since large-sized semiconductors are mounted in the components, a size of a substrate may be large and a high-density microcircuit may be necessary. When an overall size of the substrate increases, the price may significantly increase due to a decrease in the number of elements and a yield. Thus, a measure for reducing the price of the substrate has been necessary.

SUMMARY

An aspect of the present disclosure is to provide a connection structure embedded substrate in which a connection structure may be embedded without an adhesive for bonding the connection structure.

Another aspect of the present disclosure is to provide a connection structure embedded substrate in which a plurality of substrates may be embedded adjacent to each other side by side.

Another aspect of the present disclosure is to provide a connection structure embedded substrate which may improve electrical properties when a signal is transmitted between dies in high speed.

Another aspect of the present disclosure is to provide a connection structure embedded substrate in which a plurality of substrates may be connected to each other such that a signal transmission path may be reduced, thereby improving electrical properties.

One aspect of the present disclosure is to bond a connection structure using a semicured or partially cured insulating material in the connection structure and to connect a plurality of substrates to each other through a connection via.

According to an aspect of the present disclosure, a connection structure embedded substrate includes a printed circuit board including a first insulating body and a plurality of first wiring layers disposed on at least one of an external region or an internal region of the first insulating body; and a connection structure embedded in the first insulating body and including first and second substrates. The first and second substrates are disposed adjacent to each other.

According to another aspect of the present disclosure, a connection structure embedded substrate includes a printed circuit board including a first insulating layer having a cavity, and a first wiring layer disposed on one surface and the other surface of the first insulating layer; and a connection structure including first and second substrates disposed adjacent to an internal portion of the cavity.

According to another aspect of the present disclosure, a substrate includes a printed circuit board; first and second substrates embedded in the printed circuit board; and a connection via disposed between the first and second substrates and connecting the first and second substrates to each other.

According to another aspect of the present disclosure, a connection structure embedded substrate includes a printed circuit board including a plurality of first wiring layers; a connection structure embedded in the connection substrate and including a plurality of second wiring layers; and a connection via extending between two of the plurality of first wiring layers to penetrate through the connection structure, thereby connecting one or more of the plurality of second wirings layers to the two of the plurality of first wiring layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Figure 1:
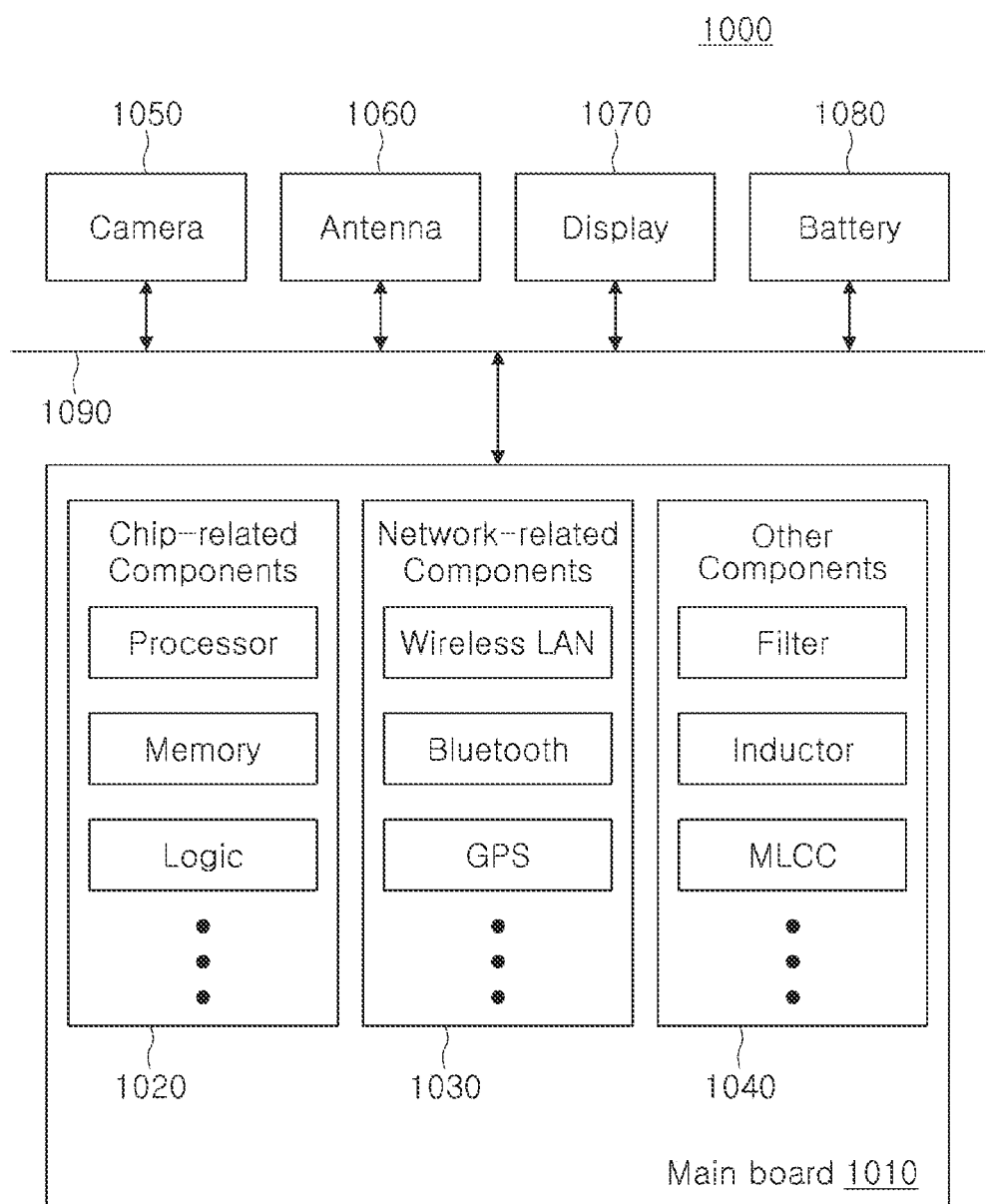
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. Also, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, and a battery 1080. However, an example embodiment thereof is not limited thereto, and these other components may include an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. Also to the above examples, other components used for various purposes depending on a type of electronic device 1000, or the like, may be included.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
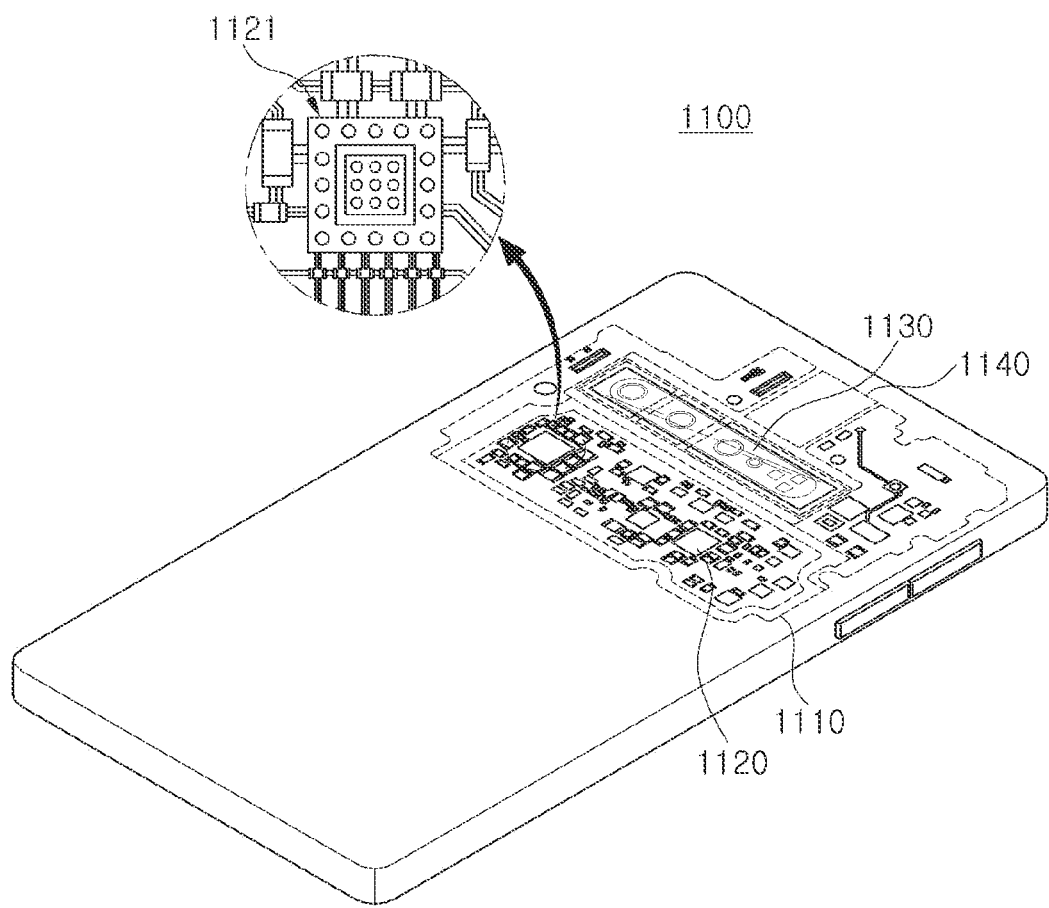
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. Some of the components 1120 may be the chip related components, such as a component package 1121, for example, but an example embodiment thereof is not limited thereto. In the component package 1121, a plurality of electronic components may be disposed on a multilayer printed circuit board in the form of surface mounting, but an example embodiment thereof is not limited thereto. The electronic device is not necessarily limited to the smartphone 1100, and may be other electronic devices as described above.

Figure 3:
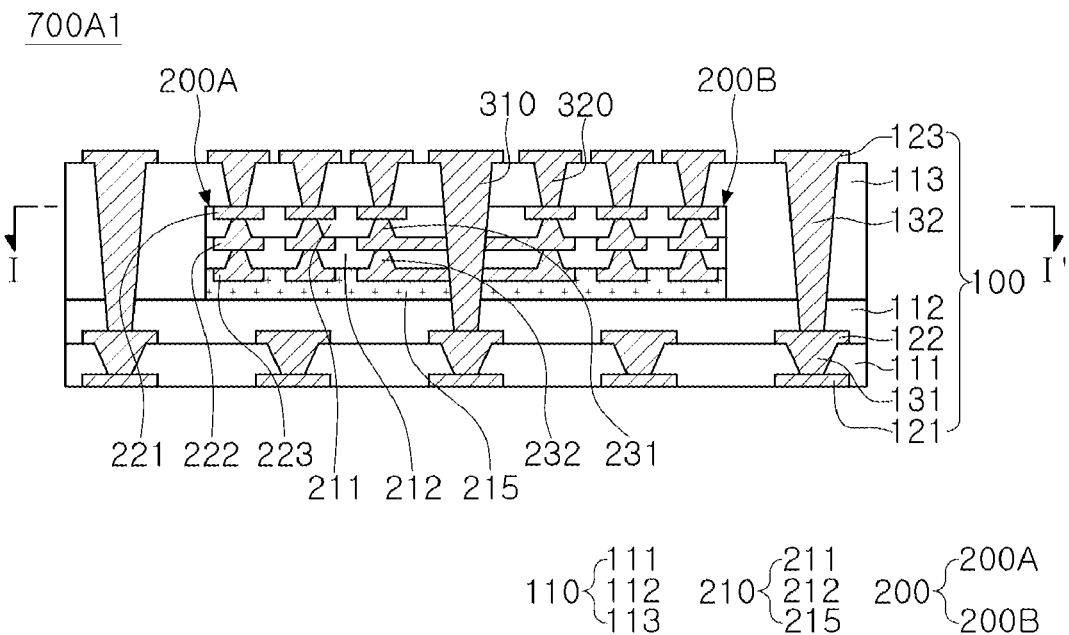
FIG. 3 is a cross-sectional diagram illustrating an example of a connection structure embedded substrate.

FIG. 3 is a cross-sectional diagram illustrating an example of a connection structure embedded substrate.

Referring to the diagram, a connection structure embedded substrate 700A1 in an example embodiment may include a first insulating body 110 including a plurality of first insulating layers 111, 112, and 113, a plurality of first wiring layers 121, 122, and 123 disposed on or in the first insulating body 110, and a plurality of first via layers 131 and 132 disposed in the first insulating body 110, and a connecting structure 200 including a second insulating body 210 buried in the first insulating body 110 and including a plurality of second insulating layers 211, 212, and 215, a plurality of second wiring layers 221, 222, and 223 disposed on or in the second insulating body 210, and a plurality of second via layers 231 and 232 disposed in the second insulating body 210, and including first and second substrates 200A and 200B adjacent to and side by side with each other. In the following description, each of the first and second substrates 200A and 200B may be a microcircuit board including a microcircuit, and the microcircuit board may include a relatively high-density circuit as compared to the printed circuit board 100. This configuration will be described in greater detail later. The first insulating layers 111, 112, and 113 of each of the first insulating body 110 and the second insulating layers 211, 212, and 215 of each of the second insulating body 210 may include insulating resin, and a lower surface of the second insulating body 210 may be in contact with the first insulating body 110.

The plurality of insulating layers 111, 112, and 113 may include a 1-1 insulating layer 111, a 1-2 insulating layer 112 and a 1-3 insulating layer 113, respectively, and may include a larger number of insulating layers than the example illustrated in FIG. 3.

The connection structure embedded substrate 700A1 in an example embodiment may have a structure in which the connection structure 200 is built into the printed circuit board 100. Also, the connection structure 200 may be bonded to the printed circuit board 100 without an adhesive by configuring a lower surface of the second insulation body 210 of the connection structure 200 to be in contact with the first insulation body 110.

In the connection structure embedded substrate 700A1 in an example embodiment, the printed circuit board 100 may be configured as a coreless substrate. For example, the printed circuit board 100 may include the 1-1 insulating layer 111, a 1-1 wiring layer 121 buried in a lower side of the 1-1 insulating layer 111, a 1-2 wiring layer 122 disposed on an upper surface of the 1-1 insulating layer 111, a 1-1 via layer 131 penetrating the 1-1 insulating layer 111 and connecting the 1-1 wiring layer 121 to the 1-2 wiring layer 122, a 1-2 insulating layer 112 disposed on an upper surface of the 1-1 insulating layer 111 and covering the 1-2 wiring layer 122, a 1-3 insulating layer 113 disposed on an upper surface of the 1-2 insulating layer 112, a 1-3 wiring layer 123 disposed on an upper surface of the 1-3 insulating layer 113, and a 1-2 via layer 132 collectively penetrating the 1-2 insulating layer 112 and the 1-3 insulating layer 113 and connecting the 1-2 wiring layer 122 to the 1-3 wiring layer 123.

As the printed circuit board 100 has a coreless structure, at least a portion of the 1-1 wiring layer 121 buried in the lower side of the 1-1 insulating layer 111 may be exposed externally of the printed circuit board 100.

The above-described printed circuit board 100 having a coreless structure may be manufactured through a one-sided built-up process, or may be manufactured through a double-sided build-up process to be separated.

Also, in the connection structure embedded substrate 700A1 in an example embodiment, the connection structure 200 including first and second substrates 200A and 200B disposed adjacent to each other on the same level may be disposed to be in contact with an upper surface of the 1-2 insulating layer 112, and may be covered by the 1-3 insulating layer 113. The configuration in which the first and second substrates 200A and 200B are disposed adjacent to each other may indicate that the first and second substrates 200A and 200B may be disposed in the same region, rather than being disposed in distinguished or separate regions, such as separated cavities. The configuration in which the first and second substrates 200A and 200B are disposed adjacent to each other does not necessarily indicate that the elements are in close contact with each other, and may indicate that the elements may be disposed in regions not distinguished by an insulating material or another cavity, or that, even when the elements are distinguished from each other, a shortest path connected to portions thereof may be arranged such that the elements may be connected to each other by the shortest distance.

Also, the first and second substrates 200A and 200B may be disposed side by side on the same level as illustrated in FIG. 3, but an example embodiment thereof not limited thereto. The configuration in which the first and second substrates 200A and 200B are disposed on the same level may indicate that the first and second substrates 200A and 200B may be disposed to be in contact with the same surface on the same level, rather than being disposed on exactly the same level horizontally.

The connection structure embedded substrate 700A1 may include a connection via 310 penetrating the 1-2 and 1-3 insulating layers 112 and 113 and the connection structure 200 and electrically connecting the 1-3 wiring layer 123, the second wiring layers 221, 222, and 223, and the 1-2 wiring layer 122. Also, the connection structure embedded substrate 700A1 may include a wiring via 320 penetrating the 1-3 insulating layer 113 and connecting the 1-3 wiring layer 123 to the 2-1 wiring layer 221.

In the connection structure embedded substrate 700A1 in the example embodiment in FIG. 3, a core layer may not be included in the printed circuit board 100, and the connection structure embedded substrate 700A1 may be manufactured through a coreless process. The first and second substrates 200A and 200B may be manufactured through the processes illustrated in FIGS. 4 to 7 to be described later, and the upper surface of the built-up second insulating layer 112 may be in contact with organic insulating layers 215 of the first and second substrates 200A and 200B and may be disposed on the same level side by side with each other.

The connection structure 200 may include the first and second substrates 200A and 200B, and each of the first and second substrates 200A and 200B may include an organic insulating layer 215 disposed on the lowermost side. In this case, the organic insulating layer 215 disposed on the lower surface of the second insulating body 210 of the connection structure 200 may be bonded onto the 1-2 insulating layer 112 while maintaining a semicured or partially cured state. After the connection structure 200 is bonded, the organic insulating layer 215 may be cured through a curing process, such that the connection structure 200 may be fastened. Accordingly, in the connection structure embedded substrate 700A1 in an example embodiment, the connection structure 200 may be fixed to the 1-2 insulating layer 112 without an adhesive.

In a conventional printed circuit board embedded with a substrate, after forming a cavity in the printed circuit board (PCB), a connection structure may need to be fixed to a stopper metal using an adhesive attached to the connection structure such that, when a subsequent process is performed, the connection structure may not move and may be fastened. In this case, an adhesive used for bonding the connection structure, such as a die attach film (DAF), may have a short lifespan and may be expensive, such that it may be difficult to manage the lifespan, which may increase costs. In the connection structure embedded substrate 700A1 in an example embodiment, the connection structure 200 may be embedded without an adhesive, such that the issues of the printed circuit board including a microcircuit embedded therein may be addressed.

Also, the connection structure embedded substrate 700A1 in an example embodiment in which no core is included in the connection structure embedded substrate may have a substrate structure including a substrate having a microcircuit with a reduced thickness. Therefore, sizes and thicknesses of the components may be reduced.

The organic insulating layer 215 of the first and second substrates 200A and 200B may include an organic insulating material which may be semicured or partially cured. For example, the organic insulating layer 215 may include an Ajinomoto build-up film (ABF), but any insulating material which may secure adhesiveness by being cured after being disposed in a state of being semicured or partially cured may be used.

The connection structure 200 may include first and second substrates 200A and 200B, and the description of the connection structure 200 described above may be applied to each of the first and second substrates 200A and 200B. The connection structure 200 may include a larger or smaller number of microcircuit substrates in addition to the first and second substrates 200A and 200B illustrated in the FIG. 3. For example, as described in FIG. 11, as an additional microcircuit substrates, third and fourth substrates 200C and 200D may disposed adjacent to the first and second substrates 200A and 200B, respectively. As above, the second wiring layers 221, 222, and 223 of the third and fourth substrates 200C and 200D may connected to the second wiring layers 221, 222, and 223 of the adjacent substrates by the connection via 310. Further, the 1-2 and 1-3 wiring layer 122 and 123 may be electrically connected to the second wiring layers 221, 222, and 223 of the third and fourth substrates 200C and 200D.

The first and second substrates 200A and 200B may be disposed on the same level in the connection structure embedded substrate 700A1 in an example embodiment. Referring to FIG. 3, each of the first and second substrates 200A and 200B may be disposed on the 1-2 insulating layer 112 of the printed circuit board 100.

The connection structure embedded substrate 700A1 in an example embodiment may include a connection via 310 penetrating the connection structure 200. The connection via 310 may be configured to penetrate at least a portion of each of the first and second substrates 200A and 200B, may be connected to the plurality of second wiring layers 221, 222, and 223 and may connect the first and second substrates 200A and 200B to each other. In a generally used connection structure embedded substrate, a substrate may be indirectly connected through a via and a wiring layer connected to an upper portion or a lower portion of the substrate. In the connection structure embedded substrate in the example embodiment, since the second substrates 200A and 200B may be directly electrically connected to each other through the connection via 310, a signal transmission distance may be shortened and signal loss may be effectively prevented.

The connection via 310 may be tapered in a direction opposite to a direct in which the second via layers 231 and 232 in the connection structure 200 are tapered. For example, as illustrated in FIG. 3, the connection via 310 may be tapered in the same direction as the direction in which the first via layers 131 and 132 of the printed circuit board 100 are tapered, and the second via layers 231 and 232 may have a tapered shape tapered in a direction opposite to the direction in which the connection via 310 is tapered.

The connection via 310 may penetrate the connection structure 200 and may also penetrate at least a portion of the first insulating body 110 of the printed circuit board 100. For example, the connection via 310 may, after the connection structure 200 is buried on the same level with the 1-1 insulating layer 111, penetrate the 1-2 and 1-3 insulation layers 112 and 113 and may penetrate the structure 200 simultaneously.

After processing and plating the connection via 310, the lowermost first wiring layer 123 of the plurality of first wiring layers 121, 122, and 123 of the printed circuit board 100 may be connected to the connection via 310. The first wiring layer 122 may function as a stopper layer in the laser processing of the connection via 310.

The uppermost second wiring layer 221 of the plurality of second wiring layers 221, 222, and 223 of the connection structure 200 may be buried in an upper side of the uppermost second insulating layer 211 of the plurality of second insulating layers 211, 212, and 215 and an upper surface thereof may be exposed. The exposed upper surface of the uppermost second wiring layer 221 of the connection structure 200 may be covered by the uppermost 1-3 insulating layer 113 of the plurality of first insulating layers 111, 112, and 113 of the printed circuit board 100 described above. The exposed upper surface of the uppermost second wiring layer 221 of the connection structure 200 may be electrically connected to the uppermost first wiring layer 123 of the plurality of first wiring layers 221, 222, and 223 of the printed circuit board 100 through a wiring via 320. The wiring via 320 may penetrate only the uppermost 1-3 insulating layer 113 of the plurality of first insulating layers 111, 112, and 113 of the printed circuit board 100.

In the description below, elements of the connection structure embedded substrate 700A1 will be described in accordance with an example embodiment with reference to the accompanied drawings.

The printed circuit board 100 may include a first insulating body 110 including a plurality of first insulating layers 111, 112, and 113, a plurality of first wiring layers 121, 122, and 123, and a plurality of first via layers 131 and 132. Each of the plurality of first wiring layers 121, 122, and 123 may include a conductor pattern, and the plurality of first via layers 131 and 132 may electrically connect the conductor patterns of the plurality of first wiring layers 121, 122, and 123 to each other.

The plurality of first wiring layers 121, 122, and 123 may include a 1-1 wiring layer 121, a 1-2 wiring layer 122, and a 1-3 wiring layer 123, respectively, and the plurality of first via layers 131, 132, and 133 may include a 1-1 via layer 131 and a 1-2 via layer 132.

An insulating material may be used for a material of the plurality of first insulating layers 111, 112, and 113, and as an insulating material, a thermosetting insulating resin such as an epoxy resin, a thermoplastic insulating resin such as a polyimide resin, or a material including a reinforcement such as an inorganic filler such as silica and/or glass fiber, such as prepreg, Ajinomoto build-up film (ABF), or the like, may be used. The number of the plurality of first insulating layers 111, 112, and 113 may be greater or less than the example in the diagram.

A metal material may be used as a material of the plurality of first wiring layers 121, 122, and 123, and as the metal material, copper (Cu), aluminum (Al), silver (Ag), tin (Sn), gold (Au), nickel (Ni), lead (Pb), titanium (Ti), or an alloy thereof may be used. Each of the plurality of first wiring layers 121, 122, and 123 may perform various functions according to a design. For example, the plurality of first wiring layers 121, 122, and 123 may include a ground pattern, a power pattern, a signal pattern, and the like. Each of these patterns may have a line shape, a plane shape, or a pad shape. The plurality of first wiring layers 121, 122, and 123 may be formed by a plating process such as an additive process (AP), a semi-AP (SAP) process, a modified SAP (MSAP) process, a tenting (TT) process, or the like, and may thus include a seed layer, an electroless plating layer, and an electrolytic plating layer formed on the basis of the seed layer. If necessary, a primer copper foil may be further included. The number of the plurality of first wiring layers 121, 122, and 123 may be greater or less than the example in the drawings.

A metal material may also be used as the material of the plurality of first via layers 131 and 132, and as a metal material, copper (Cu), aluminum (Al), silver (Ag), Tin (Sn), gold (Au), nickel (Ni), lead (Pb), titanium (Ti), or an alloy thereof may be used. Each of the plurality of first via layers 131 and 132 may include a signal connection via, a ground connection via, a power connection via, and the like, according to a design. Each of the wiring vias of the plurality of first wiring via layers 131 and 132 may be entirely filled with a metal material, or a metal material may be formed along a wall surface of the via hole. Each of the plurality of first via layers 131 and 132 may have a tapered shape. The plurality of first via layers 131 and 132 may be formed by a plating process such as AP, SAP, MSAP, TT, or the like, for example, and may thus include an electroless plating layer, a seed layer, and an electroplating layer formed on the basis of the seed layer. The number of the plurality of first via layers 131 and 132 may be greater or less than the example in the diagram.

The connection structure 200 may include the first and second substrates 200A and 200B. Each of the first and second substrates 200A and 200B may include a second insulating body 210 including a plurality of second insulating layers 211, 212, and 215, a plurality of second wiring layers 221, 222, and 223, and a plurality of second via layers 231 and 232. Each of the plurality of second wiring layers 221, 222, and 223 may include a conductor pattern, and the plurality of second via layers 231 and 232 may electrically connect the conductor patterns to each other. The connection structure 200 may be configured in the form of a coreless substrate.

As an example of the structure before the connection structure 200 is embedded in the printed circuit board 100, the connection structure 200 may include a 2-1 insulating layer 211, a 2-1 wiring layer 221 buried in an upper side of the 2-1 insulating layer 211, a 2-2 wiring layer 222 disposed on a lower surface of the 2-1 insulating layer 211, a 2-1 via layer 231 penetrating the 2-1 insulating layer 211 and connecting the 2-1 wiring layer 221 to the 2-2 wiring layer 222, a 2-2 insulating layer 212 disposed on the lower surface of the 2-1 insulating layer 211 and covering the 2-2 wiring layer 222, a 2-3 wiring layer 223 disposed on a lower surface of the 2-2 insulating layer 212, a second via layer 232 penetrating the 2-2 insulating layer 212 and connecting the 2-2 wiring layer 222 to the 2-3 wiring layer 223, and an organic insulating layer 215 disposed on the upper surface of the 2-2 insulating layer 212 and covering the 2-3 wiring layer 223.

The connection structure 200 may be bonded to the 1-3 insulating layer 113 of a precursor of the printed circuit board 100 upside down while being disposed on a carrier 710 as described later, and accordingly, the connection structure 200 in a final structure may be disposed upside down as compared to the state in which the connection structure 200 is embedded or bonded as described above.

For example, the structure of the connection structure 200 embedded in the 1-3 insulating layer 113 of the printed circuit board 100 may include the organic insulating layer 215, the 2-3 wiring layer 223 buried in an upper side of the organic insulating layer 215, the 2-2 insulating layer 212 disposed on an upper surface of the organic insulating layer 215, the 2-2 wiring layer 222 buried in an upper side of the 2-2 insulating layer 212, the second via layer 232 penetrating the 2-2 insulating layer 212 and connecting the 2-2 wiring layer 222 to the 2-3 wiring layer 223, the 2-1 insulating layer 211 disposed on the upper surface of the 2-2 insulating layer 212, the 2-1 wiring layer 221 buried in an upper side of the 2-1 insulating layer 211 and having an upper surface thereof to be exposed, and the 2-1 via layer 231 penetrating the 2-1 insulating layer 211 and connecting the 2-1 wiring layer 221 to the 2-2 wiring layer 222.

After the first and second substrates 200A and 200B are embedded in the printed circuit board 100, the connection via 310 may be formed. The connection via 310 may penetrate the connection structure 200. Specifically, the connection via 310 may penetrate at least a portion of each of the first and second substrates 200A and 200B, and may be electrically connected to at least a portion of one of the plurality of second wiring layers 221, 222, and 223 of each of the first and second substrates 200A and 200B.

Accordingly, the first and second substrates 200A and 200B, spaced apart from each other by a predetermined distance, may be electrically connected to each other through the connection via 310, and this configuration may reduce a signal transmission distance, differently from the connection through a wiring layer and a via of the printed circuit board 100.

In the case of a high-performance product, a substrate including an increased number of I/Os and an increased number of microcircuits may be necessary, and the printed circuit board 100 and a microcircuit substrate having large sizes may be used. In this case, when a large-sized microcircuit substrate is manufactured, costs for manufacturing the substrate may increase due to the reduction in the number of elements and yield. In the connection structure embedded substrate 700A1 in an example embodiment, each of the first and second boards 200A and 200B may be manufactured to have a smaller size, and the first and second boards 200A and 200B may be connected in the printed circuit board 100 through the connection via 310, such that the same effect of using a large-sized microcircuit substrate may be obtained, and the issues in productivity and costs in the manufacturing process may be addressed.

The above-described connection via 310 may penetrate the connection structure 200 and may also penetrate the 1-2 and 1-3 insulating layers 112 and 113 of the printed circuit board 100 simultaneously. Also, the connection via 310 may be electrically connected to the 1-2 and 1-3 wiring layers 122 and 123 of the printed circuit board 100. In other words, as the connection via 310 may connect the printed circuit board 100 to the connection structure 200 penetrating at least a portion of the printed circuit board 100 and the connection structure 200, and the signal transmission distance may be reduced such that signal loss may be prevented, and a signal transmission speed may increase.

An insulating material may be used as a material for the plurality of second insulating layers 211, 212, and 215. For example, as the insulating material of the 2-1 insulating layer 211 and the 2-2 insulating layer 2-2, a thermosetting resin such as epoxy resin or a thermoplastic resin such as polyimide, and the above-mentioned resin including inorganic fillers such as silica and/or reinforcing materials such as glass fibers, such an ABF, prepreg, etc., may be used. Alternatively, a photo-imagable dielectric (PID), a photo-sensitive insulating material, may be used, but an example embodiment thereof is not limited thereto.

An ABF may be used as the insulating material of the organic insulating layer 215, and any insulating material which may secure adhesiveness by being cured after being disposed in a state of being semicured or partially cured may be used. The number of the plurality of second insulating layers 211, 212, and 215 may be larger or smaller than the example illustrated in the diagram, and an example embodiment thereof is not limited thereto. Even when a larger or smaller number of second insulating layers are disposed, the lowermost insulating layer of the connection structure 200 may include an ABF as an organic insulating layer.

A metal material may be used as a material for the plurality of second wiring layers 221, 222, and 223, and as the metal material, copper (Cu), aluminum (Al), silver (Ag), Tin (Sn), gold (Au), nickel (Ni), lead (Pb), titanium (Ti), or an alloy thereof may be used. Each of the plurality of second wiring layers 221, 222, and 223 may perform various functions according to a design. For example, the plurality of second wiring layers 221, 222, and 223 may include a ground pattern, a power pattern, a signal pattern, and the like. Each of these patterns may have a line shape, a plane shape, or a pad shape. The plurality of second wiring layers 221, 222, and 223 may be formed by a plating process by a plating process, such as AP, SAP, MSAP, TT, or the like, and may thus include an electroless plating layer, a seed layer, and an electroplating layer formed on the basis of the seed layer. If necessary, a primer copper foil may be further included. The number of the plurality of second wiring layers 221, 222, and 223 may be greater or less than the example in the diagram.

A metal material may be used as a material for the plurality of second via layers 231 and 232, and as the metal material, copper (Cu), aluminum (Al), silver (Ag), Tin (Sn), gold (Au), nickel (Ni), lead (Pb), titanium (Ti), or an alloy thereof may be used. Each of the plurality of second via layers 231 and 232 may also include a signal connection via, a ground connection via, a power connection via, or the like according to a design. Each of the wiring vias of the plurality of second via layers 231 and 232 may be completely filled with a metal material, or a metal material may be formed along a wall surface of the via hole. Each of the plurality of second via layers 231 and 232 may have a tapered shape. The plurality of second via layers 231 and 232 may be formed by a plating process, such as AP, SAP, MSAP, TT, or the like, for example, and may thus include an electroless plating layer, a seed layer, and an electroplating layer formed on the basis of the seed layer. The number of the plurality of second via layers 231 and 232 may be greater or less than the example in the diagram.

The connection structure 200 including the first and second substrates 200A and 200B may include the second wiring layers 221, 222, and 223, and the second wiring layers 221, 222, and 223 may include microcircuits. As the second wiring layers 221, 222, and 223 include microcircuits, signal transmission properties may improve, and a large number of substrates having microcircuits may be disposed on a large-sized substrate, thereby improving yield and increasing the number of elements. Also, signal properties may improve by including a plurality of microcircuits.

The configuration in which the plurality of second wiring layers 221, 222, and 223 of the connection structure 200 have microcircuits will be described in greater detail. The plurality of second wiring layers 221, 222, and 223 may include a circuit having density relatively higher than that of the plurality of first wiring layers 121, 122, and 123 of the printed circuit board 100. The high density may indicate that the wiring layers may have a relatively fine pitch and/or may have a relatively small spacing.

As an example of a high-density circuit, the plurality of second wiring layers 221, 222, and 223 of the connection structure 200 may have a relatively finer pitch than those of the plurality of first wiring layers 121, 122, and 123 of the printed circuit board 100.

The pitch may refer to a distance from a center of one conductor pattern to a center of another adjacent conductor pattern in each of the wiring layers disposed on the same level. Also, in the example embodiment, the pitch of the plurality of first wiring layers 121, 122, and 123 and the plurality of second wiring layers 221, 222, and 223 does not refer to the pitch of each of the wiring layers, but may refer to an average pitch. Thus, the configuration, in which the plurality of second wiring layers 221, 222, and 223 of each of the first and second substrates 200A and 200B have a relatively finer pitch than those of the plurality of first wiring layers 121, 122, and 123 of the printed circuit board 100, may indicate that an average pitch of the plurality of second wiring layers 221, 222, and 223 may be smaller than an average pitch of the plurality of first wiring layers 121, 122, and 123.

For example, when the average pitch of at least one of the plurality of first wiring layers 121, 122, and 123 of the printed circuit board 100 is referred to as a first pitch, and the average pitch of at least one of the plurality of second wiring layers 221, 222, and 223 of the connection structure 200 is referred to as a second pitch, the first pitch may be greater than the second pitch.

As another example of high-density circuit, when an average spacing among the plurality of first wiring layers 121, 122, and 123 of the printed circuit board 100 is referred to as a first spacing, and an average spacing among the plurality of second wiring layers 221, 222, and 223 of each of the second substrates 200A and 200B of the connection structure 200 is referred to as a second spacing, the first spacing may be larger than the second spacing. The spacing may refer to an interlayer spacing among the plurality of first wiring layers 121, 122, and 123 and the plurality of second wiring layers 221, 222, and 223.

The connection structure embedded substrate 700A1 in the example embodiment in FIG. 3 may have a coreless structure, and in the printed circuit board 100, the 1-1 wiring layer 121 may be buried in the 1-1 insulating layer 111, and the first and second substrates 200A and 200B may be disposed on the upper surface of the 1-2 insulating layer 112, but an example embodiment thereof is not limited thereto. The printed circuit board 100 may have a core layer, and the first and second substrates 200A and 200B may be embedded in the cavity of the core layer. This configuration will be described in greater detail in the connection structure embedded substrate according to another example embodiment to be described later.

As the descriptions of the other configurations may be the same as in the aforementioned example embodiment, the detailed descriptions thereof will not be repeated.

FIGS. 4 to 7 are process diagrams illustrating an example of manufacturing a substrate embedded in the connection structure embedded substrate illustrated in FIG. 3.

Figure 4:
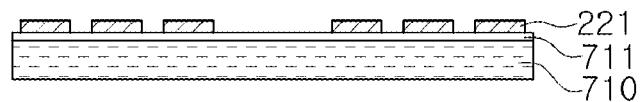
FIGS. 4 to 7 are process diagrams illustrating an example of manufacturing a substrate embedded in the connection structure embedded substrate illustrated in FIG. 3.
Figure 5:
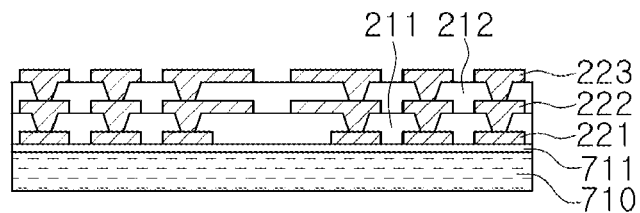
Figure 6:
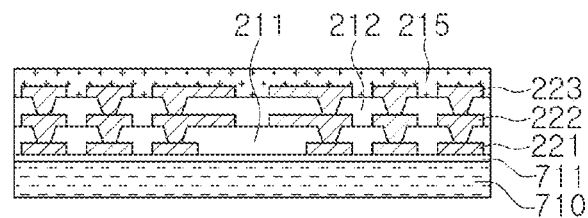

Referring to FIGS. 4 to 6, a carrier 710 having a seed layer 711 formed on at least one surface thereof may be prepared. A plurality of second insulating layers 211, 212, and 215, a plurality of second wiring layers 221, 222, and 223, and a plurality of second via layers 231, 232, and 233 may be formed on the seed layer 711 of the carrier 710. The plurality of second insulating layers 211, 212, and 215 may be formed by coating and curing an insulating material or laminating and curing an insulating film. The plurality of second wiring layers 221, 222, and 223 may be formed through a plating process. The plurality of second via layers 231, 232, 233 may be formed through a plating process after a via hole process is performed through a photolithography process. Accordingly, a laminate may be formed.

Figure 7:
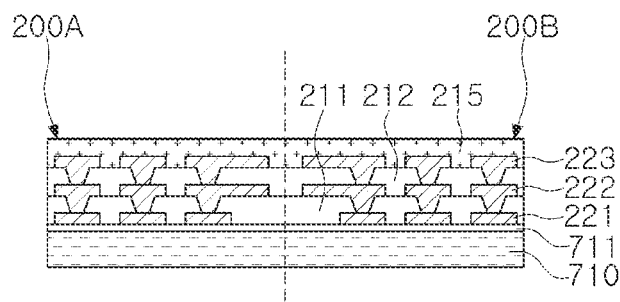

Referring to FIG. 7, the laminate may be sawed with the carrier 710 attached thereto, thereby forming the first and second substrates 200A and 200B. Thereafter, a laminate by unit, that is, the connection structure 200 including the first and second substrates 200A and 200B, may be embedded in the 1-1 insulating layer 111 of the printed circuit board 100.

The process of manufacturing the connection structure embedded substrate 700A1 will be described later.

Figure 8:
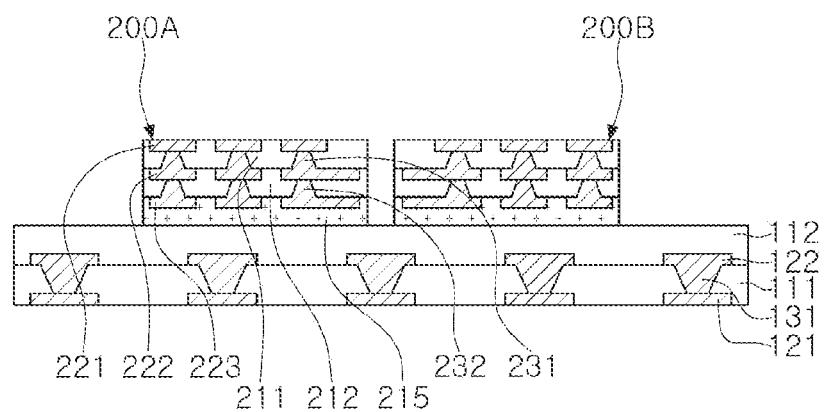
FIGS. 8 to 10 are process diagrams illustrating an example of manufacturing a connection structure embedded substrate illustrated in FIG. 3.
Figure 9:
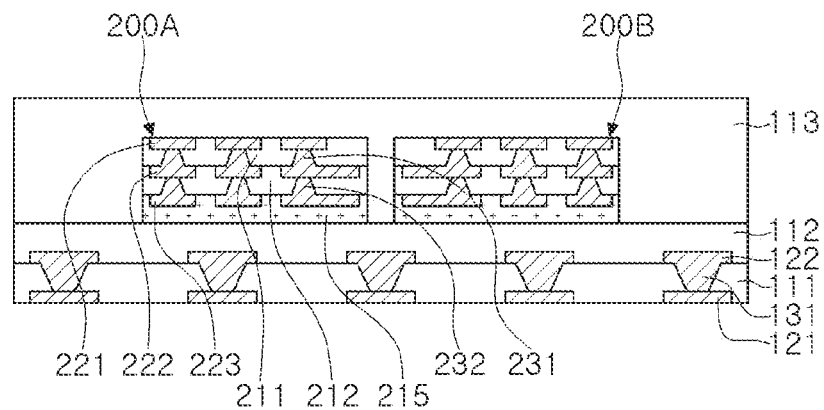
Figure 10:
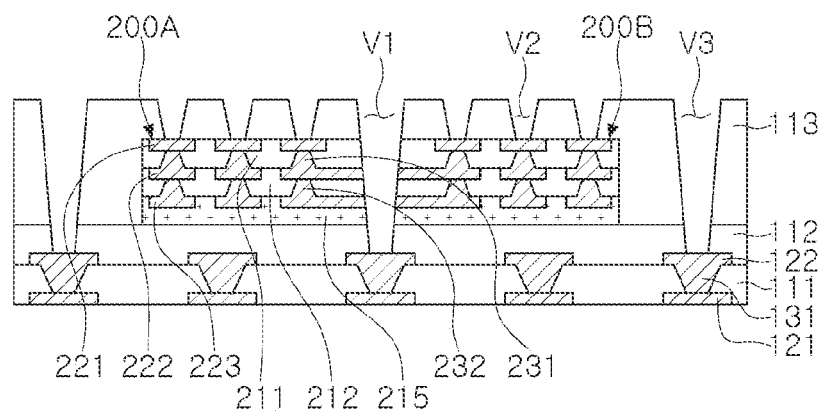

FIGS. 8 to 10 are process diagrams illustrating an example of manufacturing a connection structure embedded substrate illustrated in FIG. 3.

FIGS. 8 to 10 illustrates a printed circuit board 100 and a precursor thereof manufactured according to a one-sided build-up process, but differently from the illustrated example, the printed circuit board 100 and the precursor thereof may also be manufactured according to a double-sided build-up process.

Referring to FIG. 8, a precursor of the printed circuit board 100 may be manufactured using a carrier substrate (not illustrated). The precursor of the printed circuit board 100 may include a 1-1 insulating layer 111 in which a 1-1 wiring layer 121 is buried in a lower side, a 1-2 insulating layer 112 disposed on the 1-1 insulating layer 111 and covering the 1-2 wiring layer 122, and a −1 via layer 131 penetrating the 1-1 insulating layer 111 and connecting the 1-2 wiring layer 122 to the 1-1 wiring layer 121.

First and second substrates 200A and 200B may be disposed on the upper surface of the 1-2 insulating layer 112. The first and second substrates 200A and 200B may be disposed on the upper surface of the 1-2 insulating layer 112 while being disposed on the carrier 710, and the carrier 710 and the seed layer 711 may be removed thereafter.

In this case, the lowermost organic insulating layer 215 of each of the first and second substrates 200A and 200B may be disposed to be in contact with the 1-2 insulating layer 112.

Referring to FIG. 9, a 1-3 insulating layer 113 burying the first and second substrates 200A and 200B may be disposed.

Thereafter, referring to FIG. 10, the first to third via holes V1, V2, and V3 penetrating at least a portion of the 1-3 insulating layer 113 may be processed through a generally used process such as laser process. In this case, the first and third via holes V1 and V3 may also be formed in a portion of the 1-2 insulating layer 112.

When the first and third via holes V1 and V3 are processed, the 1-2 wiring layer 122 may function as a stopper layer to control the laser process, and when the second via hole V2 is processed, the 2-1 wiring layer 221 buried in an upper side of the 2-1 insulating layer 211 of the first and second substrates 200A and 200B may function as a stopper layer to control the laser process.

As illustrated in FIG. 10, as the first and second substrates 200A and 200B are disposed upside down and arranged to be in contact with the 1-2 insulating layer 112 from the state in the manufacturing process, and the second via hole V2 is processed, the connection via 310 formed by plating the second via hole V2 may have a tapered shape tapered in a direction opposite to the direction in which the second via layers 231 and 232 of the first and second substrates 200A and 200B are tapered.

Thereafter, by performing a process of plating the processed first to third via holes V1, V2, and V3 and a patterning process such as photolithography, the connection structure embedded substrate 700A1 in an example embodiment illustrated in FIG. 3 may be manufactured.

Figure 11:
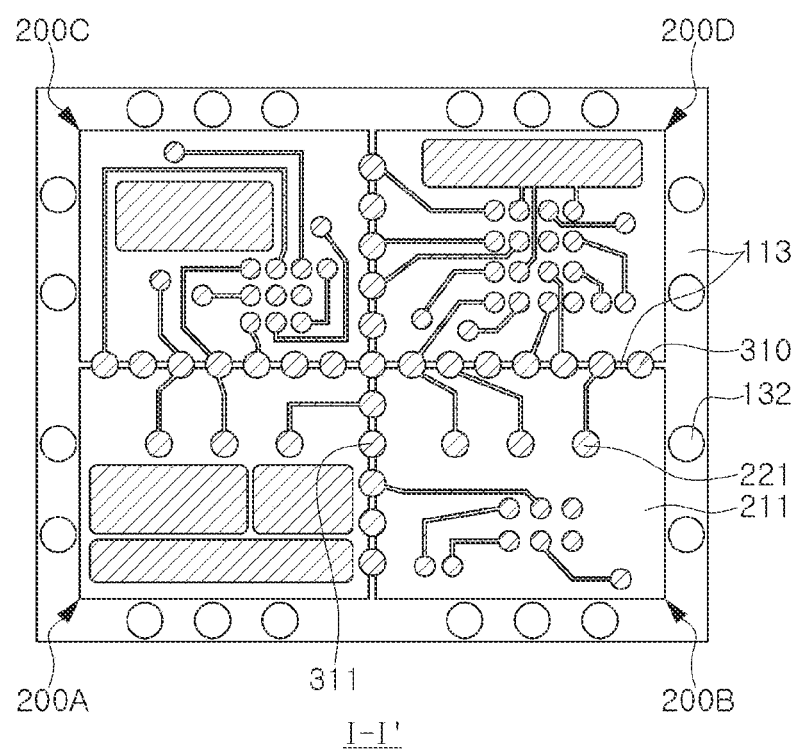
FIG. 11 is a plan diagram illustrating a connection structure embedded substrate taken long line I-I'.

FIG. 11 is a plan diagram illustrating a connection structure embedded substrate taken long line I-I'.

FIG. 11 illustrates a plan diagram illustrating the connection structure embedded substrate 700A1 taken along line I-I' in FIG. 3. As illustrated in FIG. 11, the connection structure embedded substrate 700A1 in an example embodiment may include a larger number of microcircuit substrates in addition to the first and second substrates 200A and 200B, and as an example, FIG. 11 illustrates the connection structure 200 further including third and fourth substrates. The third and fourth substrates may also be disposed adjacent to each other similarly to the first and second substrates 200A and 200B. In this case, not all the microcircuit substrates may be adjacent to each other, and at least one microcircuit substrate may be disposed adjacent to the other microcircuit substrate. The configuration in which the microcircuit substrates are adjacent to each other does not indicate that the microcircuit substrates are in close contact with each other, but may indicate that the microcircuit substrates may be disposed in regions which is not separated from each other by an insulating material or a cavity such that the microcircuit substrates may be connected to each other by a shortest distance.

As illustrated in FIG. 11, a plurality of connection vias 310 may be disposed on the same level, and each connection via 310 may be processed throughout two or more substrates. Accordingly, the connection via 310 may be configured to penetrate at least a portion of each of two or more microcircuit substrates. Also, the connection via 310 may be electrically connected to the 2-1 wiring layer 221 on the substrate as illustrated in FIG. 11, and the substrates may be electrically connected to each other through the connection via 310.

Figure 12:
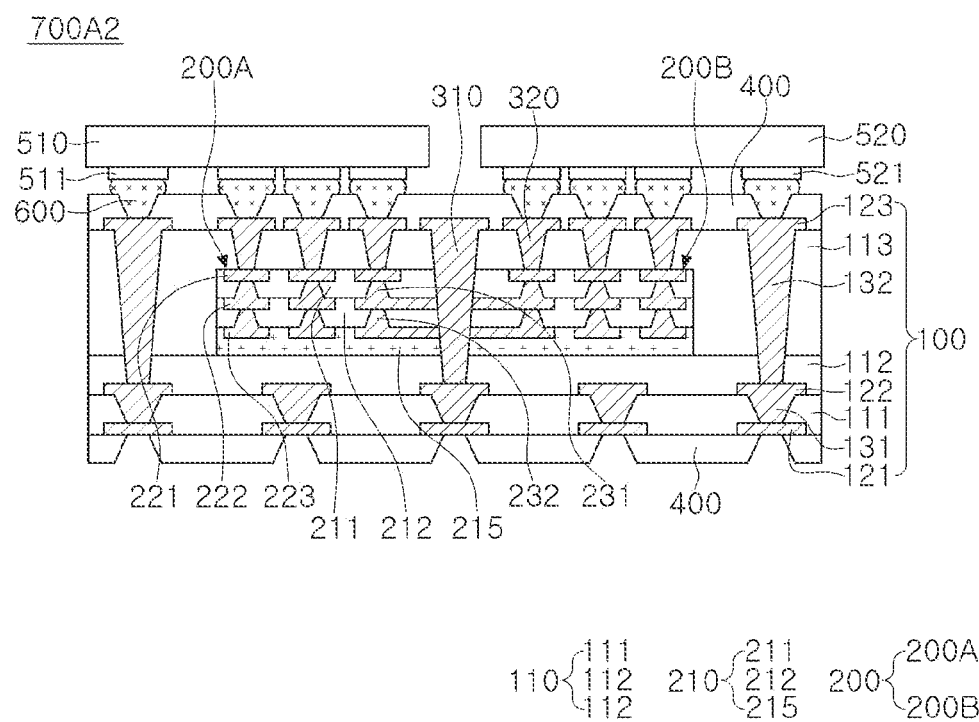
FIG. 12 is a cross-sectional diagram illustrating a modified example of a connection structure embedded substrate.

FIG. 12 is a cross-sectional diagram illustrating a modified example of a connection structure embedded substrate.

According to a modified example 700A2 of the connection structure embedded substrate illustrated in FIG. 12, a plurality of electronic components 510 and 520 may be further disposed on the connection structure embedded substrate 700A1 in the example embodiment illustrated in FIG. 3. A solder resist 400 having an opening exposing at least a portion of the first wiring layers 121, 122, and 123 may be disposed on an external layer of the printed circuit board 100. In this case, the first wiring layers 121, 122, and 123 exposed through the openings may function as pads for external connection of the printed circuit board 100.

Also, referring to the diagram, in the connection structure embedded substrate 700A2 in the modified example, a plurality of electronic components 510 and 520 may be surface-mounted on the printed circuit board 100 through the bumps 511 and 521 and an electrical connection metal 600. At least portions of the plurality of electronic components 510 and 520 may be electrically connected to each other through the connection structure 200. By the connection structure 200 and the connection via 310 penetrating the connection structure 200, electrical signal transmission properties between the plurality of electronic components 510 and 520 may improve, and a signal transmission distance may be shortened, such that signal loss may be prevented. Each of the plurality of electronic components 510 and 520 may be configured as an integrated circuit die (IC) in which hundreds to millions of devices are integrated into a single chip. If desired, the plurality of electronic components 510 and 520 may further include a chip-type inductor or a chip-type capacitor in addition to the IC die. The bumps 511 and 521 may include a metal material such as copper (Cu). The electrical connection metal 600 may include tin (Sn) or an alloy containing tin (Sn), such as solder.

As the descriptions of the other configurations may be the same as in the aforementioned example embodiment, the detailed descriptions thereof will not be repeated.

Figure 13:
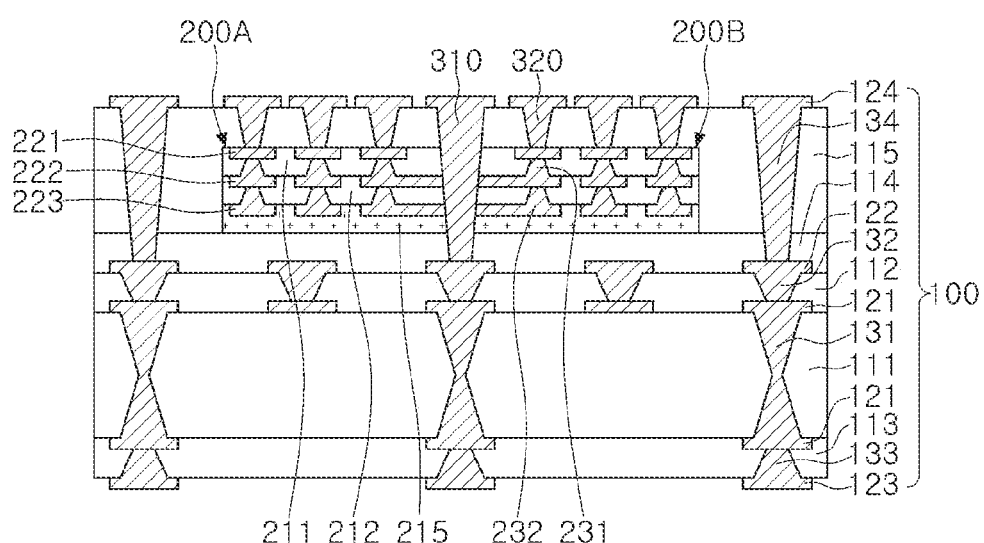
FIG. 13 is a cross-sectional diagram illustrating another example of a connection structure embedded substrate.

FIG. 13 is a cross-sectional diagram illustrating another example of a connection structure embedded substrate.

The connection structure embedded substrate 700B1 according to another example embodiment illustrated in FIG. 13 may be different from the connection structure embedded substrate 700A1 described in the aforementioned example embodiment in that a core layer may be disposed, and a layer in which the connection structure 200 is embedded may be different. Accordingly, in the description of the connection structure embedded substrate 700B1 in the example embodiment, the differences from the connection structure embedded substrate 700A1 described in the aforementioned example embodiment will be mainly described, and the same descriptions as in the aforementioned example embodiment may be applied to the overlapping elements.

Referring to FIG. 13, in the connection structure embedded substrate 700B1 in another example embodiment, the printed circuit board 100 may have a core layer, and the 1-1 insulating layer 111 of the printed circuit board 100 may function as a core layer. Accordingly, the 1-1 wiring layer 121 may be disposed on each of one surface and the other surface of the 1-1 insulating layer 111, a core layer.

In the connection structure embedded substrate 700B1 in another example embodiment, the 1-1 insulating layer 111 of the printed circuit board 100 may function as a core layer, and the 1-1 wiring layer 121 may be disposed on one surface and the other surface of the 1-1 insulating layer 111. The 1-1 wiring layer 121 and the 1-1 via layer 131 may be formed by double-sided processing the 1-1 insulating layer 111, and accordingly, the 1-1 via layer 131 formed on the 1-1 insulating layer 111 may have an hourglass shape. That is, the 1-1 via layer 131 may have a shape of which a width decreases from each of the one surface and the other surface of the 1-1 insulating layer 111 to a center of the 1-1 insulating layer 111. Also, each of the 1-2 and 1-3 via layers 132 and 133 may have a tapered shape of which a width becomes narrower towards the first wiring layer 121. Accordingly, the 1-2 and 1-3 via layers 132 and 133 may have tapered shapes tapered in opposite directions.

The printed circuit board 100 of the connection structure embedded substrate 700B1 in another example embodiment may further include 1-4 and 1-5 insulating layers 114 and 115, and the connection structure 200 may be disposed to be in contact with the upper surface of the 1-4 insulating layer 114 and may be buried by the 1-5 insulating layer 115.

The printed circuit board 100 of the connection structure embedded substrate 700B1 in another example embodiment may further include a 1-4 via layer 134 collectively penetrating the 1-4 and 1-5 insulating layers 114 and 115. The 1-4 via layer 134 may electrically connect the 1-2 wiring layer 122 to the 1-4 wiring layer 124 and may have a tapered shape tapered in the same direction as the direction in which the 1-2 via layer 132 is tapered.

The connection via 310 may penetrate the 1-4 and 1-5 insulating layers 114 and 115, and may electrically connect the 1-4 wiring layer 124 to the 1-2 wiring layer 122.

Also, the connection via 310 may penetrate at least a portion of each of the first and second substrates 200A and 200B, thereby electrically connecting the 1-4 wiring layer 124 and the 1-2 wiring layer 122 to at least a portion of the second wiring layer.

In the connection structure embedded substrate 700B1 in another example embodiment, the organic insulating layer 215 disposed on a lowermost layer of the connection structure 200 may also include an insulating material which may secure adhesiveness by being cured after being disposed in a state of being semicured or partially cured, such as an ABF, and the organic insulating layer 215 may be disposed to be in contact with the upper surface of the 1-4 insulating layer 114 in a state of being semicured or partially cured, similarly to the connection structure embedded substrate 700A1 described in the aforementioned example embodiment. Thereafter, the semicured or partially cured organic insulating layer 215 may be cured, and may allow the connection structure 200 to be adhered to the 1-4 insulating layer 114.

Accordingly, the connection structure embedded substrate 700B1 in another example embodiment does not need an adhesive layer, thereby reducing costs and improving productivity. Also, since a process of embedding the substrate using a cavity process is not used, a process of forming a cavity in the 1-5 insulating layer 115 may not be performed, thereby simplifying processes.

FIGS. 14 to 17 are process diagrams illustrating an example of manufacturing the connection structure embedded substrate illustrated in FIG. 13.

In the process of manufacturing the connection structure embedded substrate 700B1 in another example embodiment, the first and second substrates 200A and 200B obtained according to the processes illustrated in FIGS. 4 to 7 described above may be used.

Figure 14:
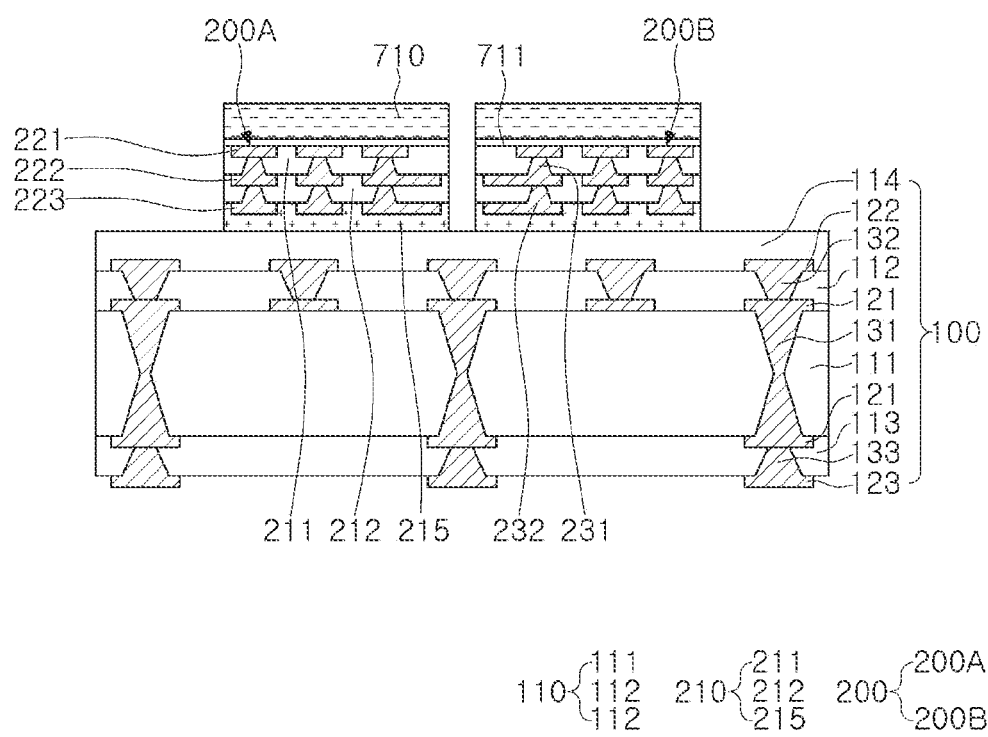
FIGS. 14 to 16 are process diagrams illustrating an example of manufacturing the connection structure embedded substrate illustrated in FIG. 13.

Referring to FIG. 14, the first and second substrates 200A and 200B, separated from each other, may be bonded to a precursor of the printed circuit board 100 including a plurality of first insulating layers 111, 112, 113, and 114, a plurality of first wiring layers 121, 122, and 123, and a plurality of first via layers 131, 132, and 133 using the organic insulating layer 215 semicured or partially cured. Specifically, the 1-4 insulating layer 114 may be disposed on an uppermost layer of the precursor of the printed circuit board 100 in FIG. 14, and the first and second substrates 200A and 200B may be disposed such that the 1-4 insulating layer 114 may be in contact with the organic insulating layer 215.

Figure 15:
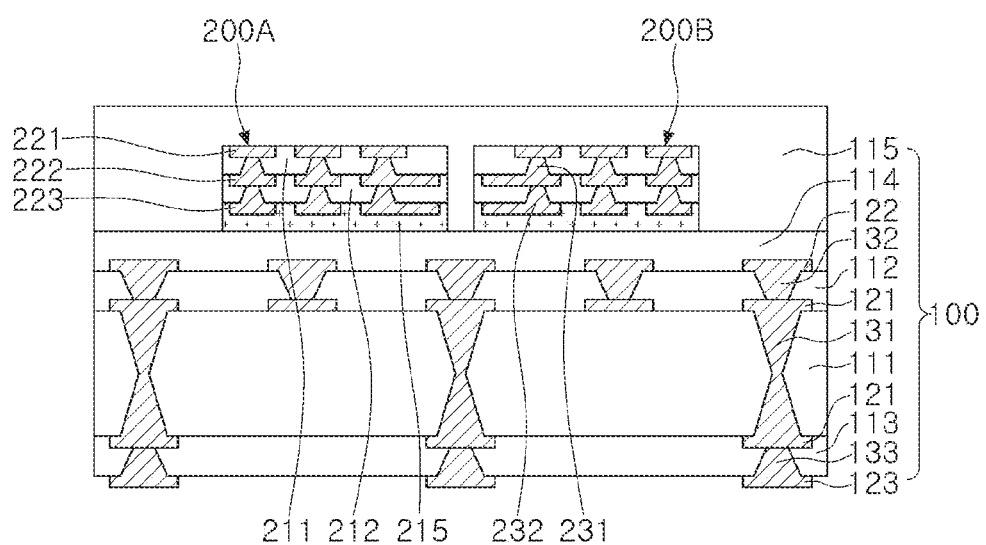

Referring to FIG. 15, the carrier 710 may be separated, and the seed layer 711 may be removed by etching. Thereafter, the connection structure 200 may be buried by the 1-5 insulating layer 115.

Figure 16:
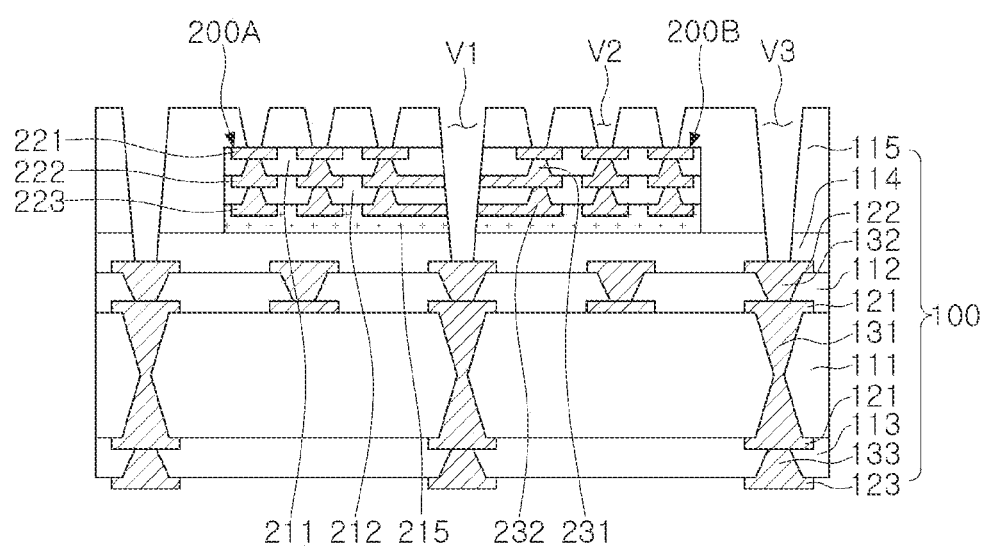

Referring to FIG. 16, the first to third vias V1, V2, and V3 may be processed. In this case, the 1-2 wiring layer 122 may function as a stopper layer during laser processing of the first and third vias V1 and V3, and the 2-1 wiring layer 221 buried in an upper side of the 2-1 insulating layer 211 may function as a stopper layer during laser processing of the second via V2. Thereafter, a patterning process such as plating and photolithography may be performed, and the organic insulating layer 215 of the connection structure 200 may be cured and fastened through a curing process, thereby manufacturing the connection structure embedded substrate 700B1 of another example embodiment.

In the connection structure embedded substrate 700B1 in another example embodiment, the 1-1 insulating layer 111 of the printed circuit board 100 may function as a core layer, and a copper clad laminate may be used in the process of manufacturing the printed circuit board 100. The 1-1 wiring layer 121 and the 1-1 via layer 131 may be formed through double-sided processing of the copper clad laminate, and accordingly, the 1-1 via layer 131 formed on the 1-1 insulating layer 111 may have an hourglass shape.

As the descriptions of the other configurations may be the same as in the aforementioned example embodiment, the detailed descriptions thereof will not be repeated.

Figure 17:
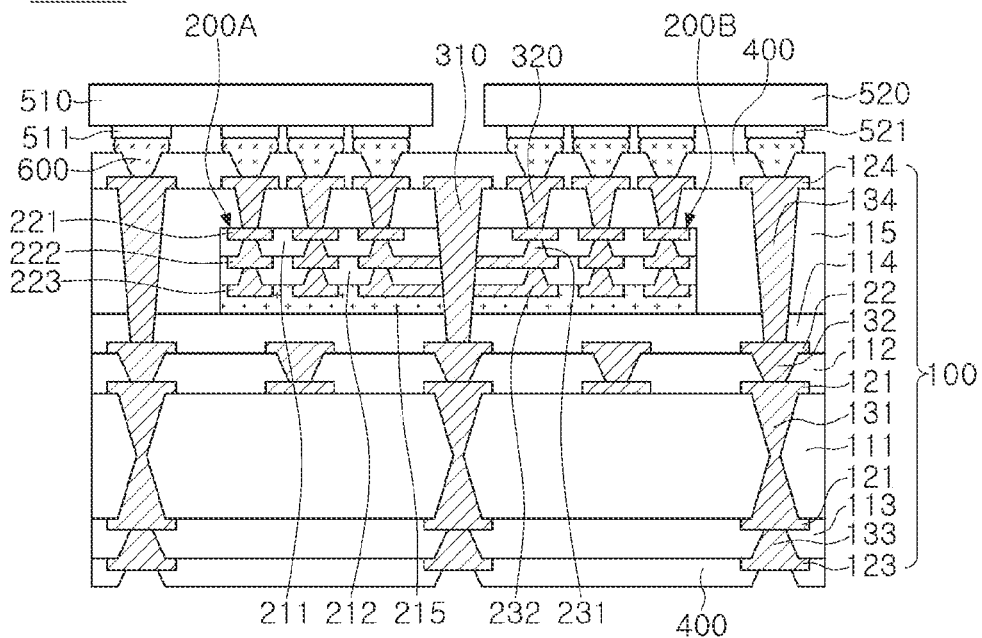
FIG. 17 is a cross-sectional diagram illustrating a modified example of a connection structure embedded substrate.

FIG. 17 is a cross-sectional diagram illustrating a modified example of a connection structure embedded substrate.

According to the modified example illustrated in FIG. 17, the connection structure internal substrate 700B2, a plurality of electronic components 510 and 520 may be further disposed on the connection structure internal substrate 700B1 illustrated in the example embodiment illustrated in FIG. 13. A solder resist 400 having an opening exposing at least a portion of the first wiring layers 121, 122, and 123 may be disposed on an external layer of the printed circuit board 100. In this case, the first wiring layers 121, 122, and 123 exposed through the opening may function as pads for external connection of the printed circuit board 100.

Also, referring to the diagram, in the connection structure embedded substrate 700B2 in the modified example, the plurality of electronic components 510 and 520 may be surface-mounted on the printed circuit board 100 through bumps 511 and 521 and an electrical connection metal 600. At least a portion of each of the plurality of electronic components 510 and 520 may be electrically connected to each other through the connection structure 200. By the connection structure 200 and the connection via 310 penetrating the connection structure 200, electrical signal transmission properties between the plurality of electronic components 510 and 520 may improve, and a signal transmission distance may be shortened, such that signal loss may be prevented. Each of the plurality of electronic components 510 and 520 may be configured as an IC die in which hundreds to millions of devices are integrated in a single chip. If desired, the plurality of electronic components 510 and 520 may further include a chip-type inductor or a chip-type capacitor in addition to the IC die. The bumps 511 and 521 may include a metal material such as copper (Cu). The electrical connection metal 600 may include tin (Sn) or an alloy containing tin (Sn), such as solder.

As the descriptions of the other configurations may be the same as in the aforementioned example embodiment, the detailed descriptions thereof will not be repeated.

Figure 18:
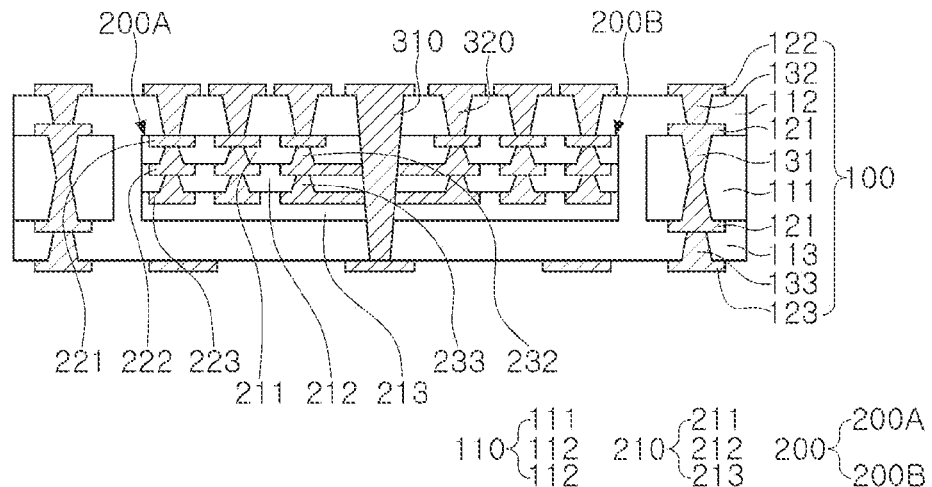
FIG. 18 is a cross-sectional diagram illustrating another example of a connection structure embedded substrate.

FIG. 18 is a cross-sectional diagram illustrating another example of a connection structure embedded substrate.

The connection structure embedded substrate 700C1 in another example embodiment illustrated in FIG. 18 may be different from the connection structure embedded substrate 700B1 described in the aforementioned example embodiment in terms of the configuration of the connection structure 200, the layer in which the connection structure 200 is disposed, and a manufacturing method thereof.

Therefore, the same descriptions as in the aforementioned example embodiment of the connection structure embedded substrate 700B1 may be applied to the overlapping elements, and differences will be mainly described in the descriptions below.

Referring to FIG. 18, in the connection structure embedded substrate 700C1 in another example embodiment, the 1-1 insulating layer 111 may function as a core layer, and the connection structure 200 may be disposed in the cavity formed in the 1-1 insulating layer 111.

In the connection structure embedded substrate 700C1 in another example embodiment, the first and second substrates 200A and 200B may include a 2-3 insulating layer 213 instead of the organic insulating layer 215. As illustrated in FIG. 18, the 2-3 insulating layer 213 of the first and second substrates 200A and 200B may include a material the same as a material of the 2-1 and 2-2 insulating layers 211 and 212, and may include a generally used insulating material such as epoxy resin, prepreg, PID, or the like, and an ABF material may not be necessarily included.

A lower surface of the second insulating body 210 of the connection structure 200 may be in contact with an upper surface of one of the plurality of first insulating layers 111, 112, and 113 of the first insulating body 110 of the printed circuit board 100. Specifically, the 2-3 insulating layer 213 disposed on a lowermost side of the connection structure 200 may be disposed to be in contact with the 1-3 insulating layer 113. A boundary among the 1-1 insulating layer 111, the 1-2 insulating layer 112, and the 1-3 insulating layer 113 may be distinct or indistinct.

In the connection structure embedded substrate 700C1 in another example embodiment, the printed circuit board 100 may have a core layer. In this case, the 1-1 insulating layer 111 disposed in an internal portion among the plurality of first insulating layers 111, 112, and 113 may function as a core layer of the printed circuit board 100. In this case, as illustrated in FIG. 18, a plurality of 1-1 wiring layers 121 may be disposed on one surface and the other surface of the 1-1 insulating layer 111, a core layer, and the 1-1 via layer.

The first via layer 131 may penetrate the 1-1 insulating layer 111 and may be electrically connected to the 1-1 wiring layer 121. For example, the first via layer 131 penetrating the 1-1 insulating layer 111, a core layer, may have an hourglass shape tapered from one surface and the other surface of the 1-1 insulating layer 111 to a central portion, and each of the 1-2 and 1-3 via layers 132 and 133 may have a tapered shape of which a width becomes narrower towards the first wiring layer 121. Accordingly, the 1-2 and 1-3 via layers 132 and 133 may have shapes tapered in opposite directions.

FIGS. 19 to 22 are process diagrams illustrating an example of manufacturing a connection structure embedded substrate illustrated in FIG. 18.

Figure 19:
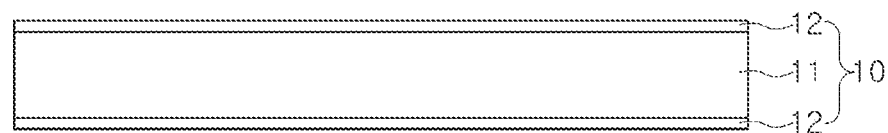
FIGS. 19 to 22 are process diagrams illustrating an example of manufacturing a connection structure embedded substrate illustrated in FIG. 18.
Figure 20:
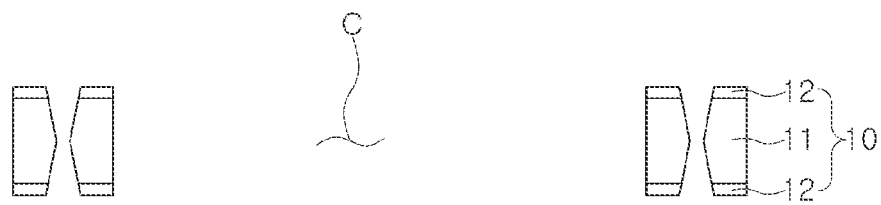

As illustrated in FIG. 19, a copper clad laminate including an insulating material 11 and a metal layer 12 disposed on one side and the other side of the insulating material 11 may be prepared. Thereafter, as illustrated in FIG. 20, a cavity C and a through hole may be formed in the copper clad laminate 10. Thereafter, a tape may be attached to one surface of the copper clad laminate 10 in which the cavity C is formed, and the first and second substrates 200A and 200B manufactured in FIG. 7 may be attached to the tape.

Thereafter, an insulating material having fluidity may fill a spare space of the cavity C, the 1-2 insulating layer 112 may be formed through curing, and the tape may be removed. The 1-3 insulating layer 113 may be laminated in a region form which the tape is removed, and the first and second substrates 200A and 200B may be completely buried in the 1-1 insulating layer 111.

In the connection structure embedded substrate 700C1 in another example embodiment, in the process of disposing the first and second substrates 200A and 200B, the 2-3 insulating layer 213 may be disposed in a state of being completely cured, rather than in a state of being semicured or partially cured, differently from the connection structure internal substrate 700A1 and 700B1 described in the aforementioned example embodiments. The 2-3 insulating layer 213 may be configured as above to be disposed in the cavity C of the 1-1 insulating layer 111 using a tape.

Figure 21:
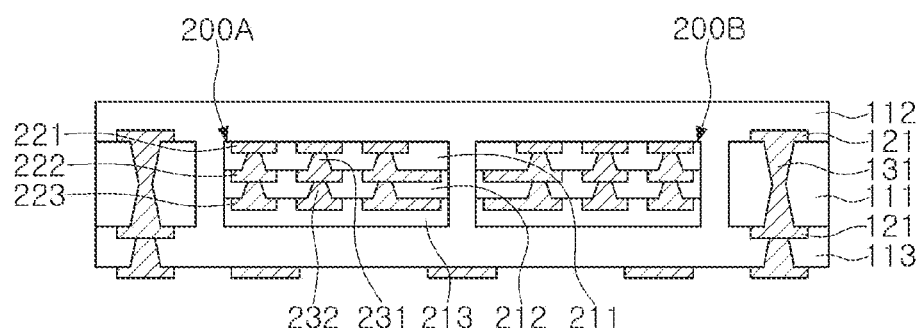

FIG. 21 illustrates a structure in which the above-described first and second substrates 200A and 200B may be completely buried in the 1-1 insulating layer 111. In this case, the lowermost 2-3 insulating layer 213 may be configured to be in contact with the 1-3 insulating layer 113.

Although not illustrated, as described above, the 2-3 insulating layer 213 may be disposed in a state of being completely cured, rather than being disposed in a state of being semicured or partially cured state. Accordingly, in the connection structure embedded substrate 700C1, the first and second substrates 200A and 200B may not be disposed upside down and may be embedded in the cavity C, such that the 2-3 insulating layer 213 may be disposed on an uppermost side as in the manufacturing process. In this case, the 2-1 wiring layer 221 may be buried on a lower side of the 2-1 insulating layer 211 and may be partially exposed towards a lower surface of the connection structure 200.

Accordingly, in the first and second substrates 200A and 200B of the connection structure embedded substrate 700C1 in another example embodiment, the plurality of second via layers 231 and 232 may have a tapered shape of which a width becomes narrower towards an upper portion, or may have a tapered shape of which a width becomes narrower towards a lower portion.

Also, the first and second substrates 200A and 200B may be arranged upside down. In this case, for example, the plurality of second via layers 231 and 232 of the first substrate 200A may be disposed upside down and may have a tapered shape of which a width becomes narrower towards an upper portion, and the plurality of second via layers 231 and 232 of the second substrate 200B may not be disposed upside down and may have a tapered shape of which a width becomes narrower towards a lower portion.

As described above, in the connection structure embedded substrate 700C1 in another example embodiment, flexibility in arrangement of the connection structure 200 may be higher than in the other example embodiments, and accordingly, flexibility in design may be secured.

Figure 22:
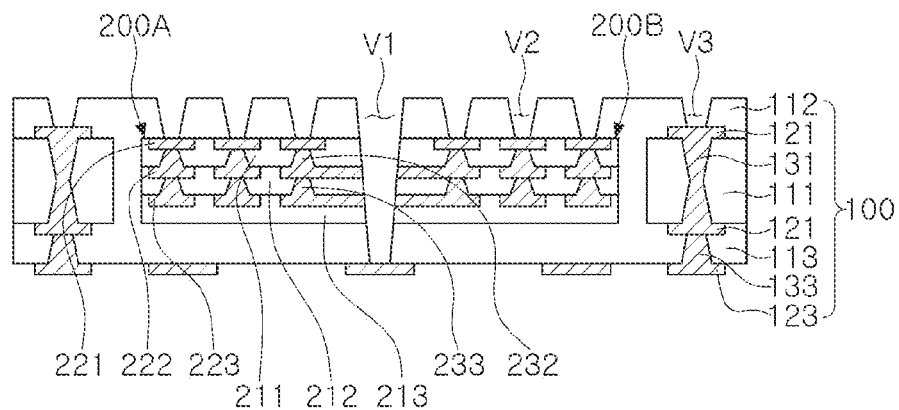

FIG. 22 illustrates a structure in which first to third via holes V1, V2, and V3 may be processed in the first insulating bodies 111, 112, and 113. In this case, the first via hole V1 may be processed using the third wiring layer 123 as a stopper layer, the second via hole V2 may be processed using the 2-1 wiring layer 221 exposed to an upper surface of the connection structure 200 as a stopper layer, and the third via hole V3 may be processed using the first wiring layer 121 as a stopper layer. Therefore, a separate stopper layer may not be necessary in the example embodiment. Thereafter, by a patterning process such as a plating process and a photolithography process, the structure of the connection structure embedded substrate 700C1 in another example embodiment illustrated in FIG. 18 may be manufactured.

Figure 23:
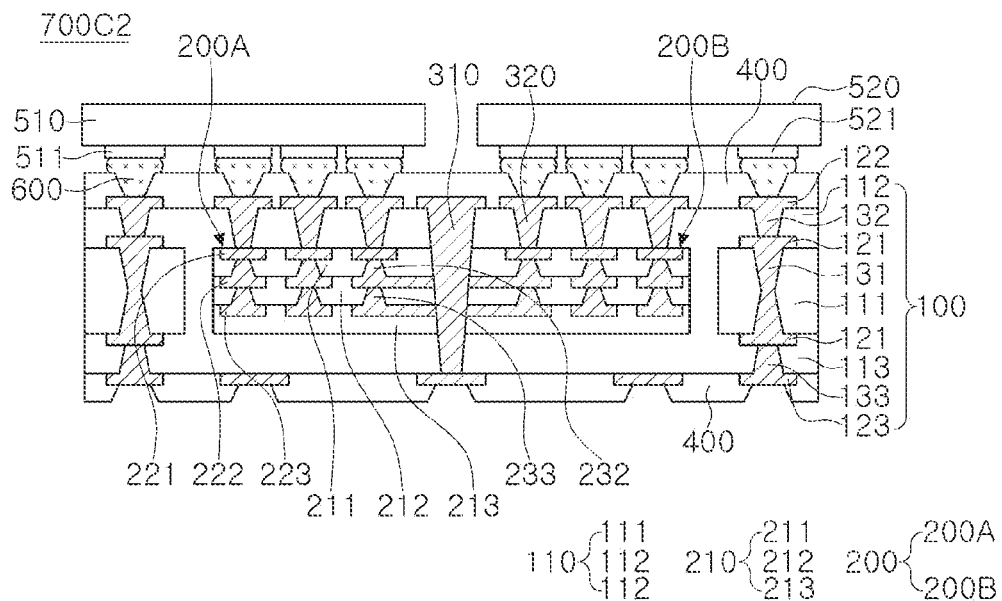
FIG. 23 is a cross-sectional diagram illustrating a modified example of the connection structure embedded substrate illustrated in FIG. 18.

FIG. 23 is a cross-sectional diagram illustrating a modified example of the connection structure embedded substrate illustrated in FIG. 18.

According to the modified example illustrated in FIG. 23, the connection structure embedded substrate 700C2, a plurality of electronic components 510 and 520 may be further disposed on the connection structure embedded substrate 700C1 of the example embodiment illustrated in FIG. 18. A solder resist 400 having an opening exposing at least a portion of the first wiring layers 121, 122, and 123 may be disposed on an external layer of the printed circuit board 100. In this case, the first wiring layers 121, 122, and 123 exposed through the opening may function as pads for external connection of the printed circuit board 100.

Referring to FIG. 23, in the connection structure embedded substrate 700C2 described in the modified example, differently from the connection structure embedded substrate 700C1 described in the aforementioned example embodiment, a plurality of electronic components 510 and 520 may be surface-mounted on the printed circuit board 100 through bumps 511 and 521 and an electrical connection metal 600. At least a portion of each of the plurality of electronic components 510 and 520 may be electrically connected to each other through the connection structure 200 and the printed circuit board. Each of the plurality of electronic components 510 and 520 may be configured as an integrated circuit (IC) die in which hundreds to millions of devices are integrated into a single chip. If desired, the plurality of electronic components 510 and 520 may further include a chip-type inductor or a chip-type capacitor in addition to the IC die. The bumps 511 and 521 may include a metal material such as copper (Cu). The electrical connection metal 600 may include tin (Sn) or an alloy containing tin (Sn), such as solder.

As the descriptions of the other configurations may be the same as in the aforementioned example embodiment, the detailed descriptions thereof will not be repeated.

According to the aforementioned example embodiments, a connection structure embedded substrate in which a connection structure may be embedded without an adhesive for bonding the connection structure may be provided.

Also, a connection structure embedded substrate in which a plurality of substrates may be embedded adjacent to each other side by side may be provided.

Further, a connection structure embedded substrate which may improve electrical properties when a signal is transmitted between dies in high speed may be provided.

Also, a connection structure embedded substrate in which a plurality of substrates may be connected to each other such that a signal transmission path may be reduced, thereby improving electrical properties may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A connection structure embedded substrate, comprising:
   a printed circuit board including a first insulating body and a plurality of first wiring layers disposed on at least one of an external region or an internal region of the first insulating body;
   a connection structure embedded in the first insulating body and including first and second substrates; and
   a connection via disposed between the first and second substrates and penetrating the connection structure,
   wherein the first and second substrates are disposed adjacent to each other, and
   wherein the connection via is spaced apart from each corner region of both the first and second substrates.

2. The connection structure embedded substrate of claim 1, wherein the first and second substrates are disposed on the same level.

3. The connection structure embedded substrate of claim 2,
   wherein each of the first and second substrates includes a second insulating body, and a plurality of second wiring layers disposed on at least one of an external region or an internal region of the second insulating body, and
   wherein at least a portion of the plurality of second wiring layer is connected to the connection via.

4. The connection structure embedded substrate of claim 3, wherein, a pitch of at least one of the plurality of first wiring layers is defined as a first pitch, a pitch of at least one of the plurality of second wiring layers is defined as a second pitch, and the first pitch is greater than the second pitch.

5. The connection structure embedded substrate of claim 3, wherein, an average spacing between the plurality of first wiring layers is defined as a first spacing, an average spacing between the plurality of second wiring layers is defined as a second spacing, and the first spacing is greater than the second spacing.

6. The connection structure embedded substrate of claim 3,
   wherein the first insulating body includes a plurality of first insulating layers, and
   wherein the connection via further penetrates one of the plurality of first insulating layers and is connected to at least a portion of the plurality of first wiring layers.

7. The connection structure embedded substrate of claim 6,
   wherein the second insulating body includes a plurality of second insulating layers, and
   wherein a lower surface of a lowermost second insulating layer of the plurality of second insulating layers is in contact with one of the plurality of first insulating layers.

8. The connection structure embedded substrate of claim 7, wherein the lowermost second insulating layer of the plurality of second insulating layers includes an Ajinomoto build-up film (ABF).

9. The connection structure embedded substrate of claim 7, wherein an uppermost second wiring layer of the plurality of second wiring layers is buried in an upper side of an uppermost second insulating layer of the plurality of second insulating layers and an upper surface of the uppermost second wiring layer is exposed.

10. The connection structure embedded substrate of claim 9, wherein the exposed upper surface of the uppermost second wiring layer of the plurality of second wiring layers is connected to at least a portion of one of the plurality of first wiring layers through a wiring via.

11. The connection structure embedded substrate of claim 6, wherein at least a portion of the plurality of first wiring layers are disposed on one surface and the other surface of one of the plurality of first insulating layers, respectively.

12. The connection structure embedded substrate of claim 6,
   wherein the printed circuit board further includes a plurality of first via layers penetrating at least a portion of the first insulating body and connecting the plurality of first wiring layers to each other,
   wherein each of the first and second substrates includes a plurality of second via layers penetrating at least a portion of the second insulating body and connecting the plurality of second wiring layers to each other, and
   wherein the connection via has a tapered shape tapered in a direction opposite to the plurality of second via layers.

13. The connection structure embedded substrate of claim 6, further comprising:
   a plurality of electronic components disposed on the printed circuit board,
   wherein the connection structure is disposed on a level the same as a level of an uppermost first insulating layer of the plurality of first insulating layers, and
   wherein at least a portion of each of the plurality of electronic components are connected to each other through the connection structure.

14. A connection structure embedded substrate, comprising:
   a printed circuit board including a first insulating layer having a cavity, and a first wiring layer disposed on one surface and the other surface of the first insulating layer;
   a connection structure including first and second substrates disposed in an internal portion of the cavity; and
   a connection via penetrating at least a portion of each of the first and second substrates,
   wherein the first and second substrates are disposed adjacent to each other, and
   wherein the connection via is spaced apart from each corner region of both the first and second substrates.

15. The connection structure embedded substrate of claim 14,
   wherein each of the first and second substrates includes a plurality of wiring layers, and
   wherein the connection via is connected to the plurality of wiring layers.

16. The connection structure embedded substrate of claim 15,
   wherein the printed circuit board further includes second and third insulating layers covering the one surface and the other surface of the first insulating layer, respectively, and second and third wiring layers disposed on the second and third insulating layers, and
   wherein the connection via further penetrates at least one of the second and third insulating layers, and is connected to the second and third wiring layers.

17. A substrate, comprising:
   a printed circuit board;
   first and second substrates embedded in the printed circuit board; and
   a connection via disposed between the first and second substrates and connecting the first and second substrates to each other, wherein the connection via is spaced apart from each corner region of both the first and second substrates.

18. The substrate of claim 17, wherein the connection via penetrates at least a portion of the first substrate and at least a portion of the second substrate.

19. The substrate of claim 17, wherein the connection via connects the first substrate and the second substrate to one wiring layer of the printed circuit board.

20. The substrate of claim 19, wherein the one wiring layer of the printed circuit board is disposed on the first substrate and the second substrate, and
the connection via connects the first substrate and the second substrate to another wiring layer of the printed circuit board below the first substrate and the second substrate.

21. The substrate of claim 17, wherein the printed circuit board includes an insulating layer having a portion covering upper surfaces of the first substrate and the second substrate, and another portion disposed between the first substrate and the second substrate.

22. The substrate of claim 21, wherein the connection via penetrates through the portion of the insulating layer disposed between the first substrate and the second substrate.

23. The substrate of claim 21, further comprising wiring vias extending in the portion of the insulating layer covering the first substrate and the second substrate, and connected to wiring layers of the first substrate and the second substrate, respectively.

24. The substrate of claim 23, wherein a tapered direction of vias in one of the first substrate and the second substrate is opposite to a tapered direction of the wiring vias and a tapered direction of the connection via.

25. A connection structure embedded substrate, comprising:
a printed circuit board including a plurality of first wiring layers;
a connection structure embedded in the printed circuit board and including a plurality of second wiring layers; and
a connection via extending between two of the plurality of first wiring layers to penetrate through the connection structure, thereby connecting one or more of the plurality of second wirings layers to the two of the plurality of first wiring layers.

26. The connection structure embedded substrate of claim 25, wherein the connection structure is disposed between the two of the plurality of first wiring layers.

27. The connection structure embedded substrate of claim 25, wherein a pitch of at least one of the plurality of first wiring layers is greater than a pitch of at least one of the plurality of second wiring layers.

28. The connection structure embedded substrate of claim 25, wherein the connection structure includes an Ajinomoto build-up film (ABF) in contact with the printed circuit board.

29. The connection structure embedded substrate of claim 25, wherein an uppermost second wiring layer of the plurality of second wiring layers is buried in an uppermost insulating layer of the connection structure, and an upper surface of the uppermost second wiring layer is exposed from the uppermost insulating layer of the connection structure.

30. The connection structure embedded substrate of claim 29, further comprising a wiring via connecting one of the two of the plurality of first wiring layers to the uppermost second wiring layer.

31. The connection structure embedded substrate of claim 30, wherein a tapered direction of vias in the connection structure is opposite to a tapered direction of the wiring via and a tapered direction of the connection via.

* * * * *